(12) United States Patent
Reingardt (10) Patent No.: US 12,533,705 B2
(45) Date of Patent: Jan. 27, 2026

(54) MULTI-ORIFICE NOZZLE

(71) Applicant: SIKA TECHNOLOGY AG, Baar (CH)

(72) Inventor: Bernhard Reingardt, Thalwil (CH)

(73) Assignee: SIKA TECHNOLOGY AG, Baar (CH)

( * ) Notice: Subject to any disclaimer, the term of this patent is extended or adjusted under 35 U.S.C. 154(b) by 0 days.

(21) Appl. No.: 18/690,898

(22) PCT Filed: Nov. 9, 2022

(86) PCT No.: PCT/EP2022/081191
§ 371 (c)(1),
(2) Date: Mar. 11, 2024

(87) PCT Pub. No.: WO2023/088735
PCT Pub. Date: May 25, 2023

(65) Prior Publication Data
US 2024/0335854 A1 Oct. 10, 2024

(30) Foreign Application Priority Data
Nov. 17, 2021 (EP) .................................... 21208880

(51) Int. Cl.
*B05C 9/06* (2006.01)
*B05C 5/02* (2006.01)
(Continued)

(52) U.S. Cl.
CPC .............. *B05C 9/06* (2013.01); *B05C 5/0216* (2013.01); *B05C 5/027* (2013.01); *B05C 17/00516* (2013.01); *B05D 1/26* (2013.01)

(58) Field of Classification Search
CPC ........ B05C 5/027; B05C 17/0051; B05D 7/50
See application file for complete search history.

(56) References Cited

U.S. PATENT DOCUMENTS

| | | | | |
|---|---|---|---|---|
| 4,430,784 A | * | 2/1984 | Brooks | G01D 15/18 72/340 |
| 5,000,988 A | * | 3/1991 | Inoue | B05C 5/0216 427/427.3 |

(Continued)

FOREIGN PATENT DOCUMENTS

| | | |
|---|---|---|
| EP | 1584449 A1 | 10/2005 |
| KR | 10-2014-0006416 A | 1/2014 |

OTHER PUBLICATIONS

Feb. 13, 2023 International Search Report issued in International Patent Application No. PCT/EP2022/081191.

(Continued)

*Primary Examiner* — Cachet I Proctor
(74) *Attorney, Agent, or Firm* — Oliff PLC (57) ABSTRACT

A multi-orifice nozzle for application of a bead from at least two different fluid materials on a substrate, includes: (a) a nozzle housing having a front side to be oriented forward in an intended direction of application during use of the nozzle; (b) at least a first discharge orifice for application of a first fluid material on the substrate and a second discharge orifice for application of a second fluid material on the substrate; whereby, the first and the second discharge orifices are arranged such that when moving the nozzle with the front side oriented forward in the intended direction of application, with respect to the intended direction of application, the second discharge orifice is arranged behind the first discharge orifice.

15 Claims, 3 Drawing Sheets

(51) Int. Cl.
*B05C 17/005* (2006.01)
*B05D 1/26* (2006.01)

(56) References Cited

U.S. PATENT DOCUMENTS

| | | | | |
|---|---|---|---|---|
| 6,063,055 | A | * | 5/2000 | Epstein ............. B05C 17/00553 604/82 |
| 2014/0102628 | A1 | | 4/2014 | Ezzat et al. |
| 2021/0038210 | A1 | * | 2/2021 | Lamazouade .... A61B 17/00491 |

OTHER PUBLICATIONS

Feb. 13, 2023 Written Opinion issued in International Patent Application No. PCT/EP2022/081191.

* cited by examiner

Fig. 9

MULTI-ORIFICE NOZZLE

TECHNICAL FIELD

The invention relates to a multi-orifice nozzle for application of a bead from at least two different fluid materials on a substrate, and a kit-of parts comprising a multi-orifice nozzle and a dispensing device. Additionally, the invention is concerned with a method for application of a bead from at least two different fluid materials on a substrate and the use of the multi-orifice nozzle for adhesively bonding a glass and/or ceramic material, especially a vehicle window, to a structural element, in particular to a vehicle body.

BACKGROUND ART

The use of adhesives in industrial assembly of components has become a standard throughout all kinds of industries. Thereby, for many applications, the adhesive is applied to a first component in the form of an adhesive bead and then the second component to be bonded is pressed on with it.

Regardless of the type of processing, adhesives need to be adapted to the specific materials of the components to be bonded in order to obtain a reliable bonding. When bonding components of identical materials, this usually is a straightforward task. However, bonding of components consisting of different materials is much more demanding. Specifically, obtaining a sufficiently good adhesion to both of the two different materials in combination with the desired properties of the adhesive, such as e.g. mechanical strength, flexibility, shelf life and the like, hardly is achievable in one single adhesive formulation.

In order to tackle this problem, it is known practice to pretreat at least one of the components to be bonded before bonding with the adhesive. For example, the surfaces of the components to be bonded can be chemically treated with so called primers or activators. Thereby, an undercoat or preparatory coating, respectively, is produced on the surface to be bonded giving rise to better adhesion of the adhesive which is applied thereon.

For example, in automotive manufacturing, vehicle windshields and glass screens usually are directly bonded to the vehicle body. This procedure is called direct glazing. However, due to the different materials, i.e. glass and metal/paint, the windshields and glass screens usually must be pretreated in a first step using an activator or a primer before application of the adhesive composition in a subsequent step.

However, such two-step procedures are time consuming, and the requirement of short flash-off times or long open times of the pre-treatments often limit the flexibility on the production lines. Furthermore, most of the direct glazing applications are still performed with solvent based activators and primers which are problematic with regard to current EHS regulations.

Thus, there is still a need for new and improved solutions that overcome the aforementioned disadvantages as far as possible.

DISCLOSURE OF THE INVENTION

It is an object of the present invention to provide improved solutions for bonding of components consisting of different materials. In particular, the solution should allow for the most flexible and rapid bonding possible.

Surprisingly, it has been found that these objects can be achieved with a multi-orifice nozzle according to claim 1.

Specifically, the inventive multi-orifice nozzle for application of a bead from at least two different fluid materials on a substrate, comprises:
a) a nozzle housing having a front side to be oriented forward in an intended direction of application during use of the nozzle,
b) at least a first discharge orifice for application of a first fluid material on the substrate and a second discharge orifice for application of a second fluid material on the substrate;
c) whereby, the first and the second discharge orifices are arranged such that when moving the nozzle with the front side oriented forward in the intended direction of application, with respect to the intended direction of application, the second discharge orifice is arranged behind the first discharge orifice.

With the inventive multi-orifice nozzle, it is in particular possible to apply at least two layers of different fluid materials, e.g. two different adhesives or a combination of an adhesive and a primer, on a substrate in one single application step. Thereby, the nozzle can be configured such that the second fluid material fluid material can be placed on top of the first fluid material essentially simultaneously with the application of the first fluid material. This is possible because, with regard to the direction of application, the second discharge orifice is arranged behind the first discharge orifice. Thus, thanks to the inventive approach, a layered structure as obtainable in a standard two-step application process can be obtained more rapidly. Furthermore, flash-off times or open times no longer are an issue, which increases the flexibility on production lines.

Further aspects of the present invention are the subject matter of the further independent claims. Particularly preferred embodiments are outlined throughout the description and the dependent claims.

WAYS OF CARRYING OUT THE INVENTION

A first aspect of the present invention is directed to a multi-orifice nozzle for application of a bead from at least two different fluid materials on a substrate, comprising:
a) a nozzle housing having a front side to be oriented forward in an intended direction of application during use of the nozzle;
b) at least a first discharge orifice for application of a first fluid material on the substrate and a second discharge orifice for application of a second fluid material on the substrate;
c) whereby, the first and the second discharge orifices are arranged such that when moving the nozzle with the front side oriented forward in the intended direction of application, with respect to the intended direction of application, the second discharge orifice is arranged behind the first discharge orifice.

A "fluid material" in particular is meant to be a liquid and/or pasty material. Preferably, a viscosity of the fluid material is such that it does not run and/or spread on the substrate surface on which it is applied. Especially, the fluid material is selected from primers, adhesives and/or sealants.

A "bead from at least two different fluid materials" is meant to be an elongated strip of at least two different fluid materials with a defined cross-section. The cross-section can in principle have any shape, e.g. rectangular, triangular, trapezoidal, pentagonal and/or semi-circular. Especially the bead is an adhesive bead.

In particular, the first discharge orifice and the second discharge orifice are configured for producing a layered bead in which the second fluid material is applied over the first fluid material, when moving the nozzle with the front side oriented forward in the intended direction of application.

Especially, the first discharge orifice and the second discharge orifice are arranged in a common plane.

In particular, the first discharge orifice and the second discharge orifice are arranged in a downstream end face of the nozzle housing. Thereby, preferably, the downstream end face of the nozzle housing is configured as a contact surface to be oriented towards the substrate surface during use of the nozzle.

These configurations allow for a precise layering of the two different fluid materials on the substrate surface. Furthermore, the second fluid material can be pressed onto the first fluid material in a defined manner in order to obtain a bead with defined overall thickness and an increased adhesion between the two fluids.

Especially, the multi-orifice nozzle is configured such that the first fluid material can be applied separately and/or independently of the second fluid material. This allows for controlling the thickness of the individual layers of the respective fluid materials in the bead in wide ranges.

According to a preferred embodiment, the multi-orifice nozzle comprises a first fluid line, which is in fluid communication with the first discharge orifice, for supplying the first fluid material to the first discharge orifice and a second fluid line, which is in fluid communication with the second discharge orifice for supplying the second fluid material to the second discharge orifice.

Thereby, preferably, a first inlet of the first fluid line and/or a second inlet of the second fluid line is/are arranged at an upstream end face of the nozzle housing, whereby, preferably, the upstream end face is arranged opposite the downstream end face of the nozzle housing.

Preferably, the inlets protrude from the upstream end face of the nozzle housing in the form of tubular sockets.

With such a configuration, the first and the second fluid material can be easily and directly supplied individually and separately through the respective first and the second discharge orifice.

Preferably, a width of the first discharge orifice is 90-110%, especially 95-105%, of a width of the second discharge orifice, whereby the widths of the discharge orifices are measured in a direction perpendicular to the intended direction of application and/or in a direction parallel to the front side.

This configuration allows for producing layered beads in which the first and the second fluid material as applied on the substrate surface essentially have a similar width. Put differently, in this case, the second fluid material essentially covers the whole surface of the first fluid material as applied on the surface.

However, for special applications, other ratios of the widths of the tow discharge orifices can be suitable as well.

For example, in further preferred configuration, a width of the first discharge orifice is larger than a width of the second discharge orifice, whereby the widths of the discharge orifices are measured in a direction perpendicular to the intended direction of application and/or in a direction parallel to the front side. Especially, the width of the first discharge orifice equals 1.1-3 times, in particular 1.1-2 times, for example 1.1-1.5 times, the width of the second discharge orifice.

This configuration allows for producing layered beads in which the first fluid material as applied on the substrate surface has a width larger than the second fluid material. If, for example, the second fluid material is applied with a larger height, the width of the first and the second fluid materials can be adjusted upon compression or during bonding, respectively, when using such a configuration.

For example, the first nozzle orifice is configured for producing a flat bead, especially with rectangular cross-section, and/or the second discharge orifice is configured for producing a triangular-shaped bead.

In particular, (i) the first discharge orifice is formed by a slit-shaped opening in the downstream end face of the nozzle housing and/or (ii) the second nozzle orifice is formed by a rear opening, especially a triangular-shaped opening, in the backside of the nozzle and a base opening, especially a rectangular opening, in the downstream end face of the nozzle housing, whereby the rear opening and the base opening form a continuous opening.

The backside of the nozzle is meant to be the side of the nozzle housing to be oriented backwards with respect to the intended direction of application during use of the nozzle.

The slit-shaped opening preferably has a longitudinal axis running perpendicular to the direction of application and/or parallel to the front side of the nozzle housing.

This design allows for producing rectangular, triangular or pentagon shaped beads consisting of the first fluid material in direct contact with the substrate and the second fluid material applied on top of the first fluid material. Such kind of beads are for example suitable for direct glazing.

Especially, an opening area of the first discharge orifice is smaller than an opening area of the second discharge orifice. With such a setup, a thin layer of the first material and a thicker layer of the second fluid material can be produced. For many applications, layered beads with such structures are highly beneficial.

Preferably, the downstream end face of the nozzle housing stands at an angle of 30-85°, especially 45-75°, to a longitudinal axis of the nozzle housing running from the upstream end face to the downstream end face. In this configuration, the multi-orifice-nozzle can be pressed against the substrate at an angle what is very convenient for handheld applications.

According to another preferred embodiment, the downstream end face of the nozzle housing is perpendicular to the longitudinal axis of the nozzle housing running from the upstream end face to the downstream end face. This design is preferred for automatic applications, e.g. with a robotic system.

In an especially preferred embodiment, the multi-orifice nozzle comprises no further discharge orifices in addition to the above described first discharge orifice and second discharge orifice. Such a nozzle is efficiently producible and can be used for most applications.

However, in another preferred embodiment, the multi-orifice nozzle, in addition to the above described first discharge orifice and second discharge orifice, comprises at least one, especially at least two, further discharge orifice(s).

Especially, the at least one further discharge orifice is arranged such that when moving the nozzle with the front side oriented forward in the intended direction of application, with respect to the intended direction of application, the at least one further discharge orifice is arranged behind the second discharge orifice. This allows for producing layered beads comprising three or more layers.

In another embodiment, the at least one further discharge orifice is arranged such that when moving the nozzle with the front side oriented forward in the intended direction of application, with respect to the intended direction of application, the at least one further discharge orifice is arranged sideways of the first and/or the second discharge orifice. This allows for producing beads comprising at least two sections of different fluid materials running in parallel side by side on the substrate.

Preferably, the at least one further discharge orifice is arranged in a common plane with the first and the second discharge orifice, in particular in the downstream end face of the nozzle housing.

In case the multi-orifice nozzle comprises at least one further discharge orifice, there is at least one further fluid line, which is in fluid communication with the at least one further discharge orifice, for supplying at least one further fluid material to the at least one further discharge orifice. In addition, at least one further inlet of the at least one further fluid line is arranged at the upstream end face of the nozzle housing. Preferably, the at least one further inlet protrudes from the upstream end face of the nozzle housing in the form of a further tubular socket.

The housing of the multi-orifice nozzle can have any shape. Especially, at least a lower half of the nozzle housing and/or a downstream end of the nozzle housing has an elongated cylindrical or an elongated cuboidal shape. Thereby, preferably, a longitudinal axis of the nozzle housing runs from the upstream end face to the downstream end face. Especially, the nozzle housing has the form of an elongated cuboidal shape. This allows for a highly compact design.

Furthermore, the multi-orifice nozzle, at its upstream end, comprises an interface for coupling the multi-orifice nozzle with a dispensing device. Especially, the interface is configured as a circumferential flange, for example a circular flange.

However, depending on the dispending device, other interfaces might be suitable as well.

A further aspect of the present invention is related to a kit of parts comprising (i) a multi-orifice nozzle according to any of preceding claims, and (ii) a dispending device. Thereby, the dispensing device is configured for coupling the multi-orifice nozzle and for supplying a first fluid material from a first reservoir and a second fluid material from a second reservoir such that, if the multi-orifice nozzle is coupled to the dispensing device, the first fluid material can be discharged through the first discharge orifice of the nozzle and the second fluid material can be discharged through the second discharge orifice of the nozzle.

Optionally, the dispending device is configured for supplying at least one further fluid material from at least one further reservoir such that, if the multi-orifice nozzle is coupled to the dispensing device, the at least one further fluid material can be discharged through the at least one further discharge orifice of the nozzle, if the latter is present.

In a preferred embodiment, the dispensing device comprises at least a first fluid connector for connecting the first inlet of the multi-orifice nozzle with the first reservoir and a second fluid connector for connecting the second inlet of the multi-orifice nozzle with the second reservoir. Thereby, one or more supply devices, as described below, may be interconnected as well.

The fluid connectors can e.g. be selected from hoses and/or tubes. Hoses can in particular be flexible hoses. The fluid reservoirs for example are cartridges and/or drums.

Preferably, for coupling of the multi-orifice nozzle, the dispensing device comprises an interface with a positive-locking and/or a force-fit locking mechanism. More preferably, the interface further comprises at least two fluid connectors for connecting the first inlet of the multi-orifice nozzle with the first reservoir and the second inlet of the multi-orifice nozzle with the second reservoir. Optionally, at least one further fluid connector is present for connecting the at least one further inlet of the multi-orifice nozzle with the at least one further reservoir, if present.

Especially, the dispensing device comprises a first supply device, e.g. a first pump, for supplying the first fluid material from the first reservoir and a second supply device, e.g. a second pump, for supplying the second fluid from the second reservoir. Optionally, at least one further supply device is present, e.g. a pump, for supplying the at least one further fluid from the at least one further reservoir.

The supply devices can for example be interconnected between the reservoir(s) and the inlet(s) of the multi-orifice nozzle.

The supply devices, e.g. pumps, can be operated independently of each other or one or more supply devices can be operated depending on one of the other supply devices.

According to a further preferred embodiment, the dispensing device is configured for individually controlling the flow rate of the first fluid material and the flow rate of the second fluid material. Optionally, the flow rate of the at least one further fluid material is controllable likewise. Thereby, in particular, the dispensing device comprises a control unit for automatically regulating the flow rates of the first and the second fluid material, and optionally the flow rate of the at least one further fluid material. In this case, for example, the control unit is configured for controlling the supply devices, e.g. pumps, independently of each other.

For example, the multi-orifice nozzle can be coupled to the supply devices and/or fluid reservoirs via the above-mentioned fluid connectors, e.g. hoses, preferably flexible hoses. Thereby, the multi-orifice nozzle can be attached to an automatic application device, e.g. a robotic device. In this case, the fluid reservoirs are for example large-volume reservoirs such as e.g. drums. This allows the multi-orifice nozzle to be used at large production lines.

According to another preferred embodiment, the dispensing device is a handheld device for manual application. In this case, the fluid reservoirs and/or supply devices can be included in the handheld device and/or the handheld device can comprise one or more sockets for connecting the multi-orifice nozzle with the supply devices and/or fluid reservoirs via the above-mentioned fluid connectors, e.g. hoses.

Another aspect of the present invention is directed to a method for application of a bead from at least two fluid materials on a substrate with a multi-orifice nozzle as described above or with a kit of parts as described above, comprising the step of moving the multi-orifice nozzle in a direction of application with its front side oriented towards the direction of application along a substrate and thereby applying a first fluid material through the first discharge orifice and a second fluid material through the second discharge orifice.

Thereby, optionally, at least one further fluid material is applied on top of the second fluid material and/or sideways of the first and/or the second fluid material through at least one further discharge orifice.

Especially, the first fluid material is directly applied on the substrate and the second fluid material is applied over the first fluid material, whereby a layered bead, in which the second fluid material is placed over the first fluid material, is obtained.

Preferably, the first and the second fluid material are applied such that a first thickness of the first fluid material as applied on the substrate is smaller than a second thickness of the second fluid material as applied on the first fluid material, whereby, especially a ratio of the second thickness to the first thickness is from 1000:1 to 2:1, for example 100:1 to 25:1.

In particular, during application, a ratio of flow rate of the first fluid material to a flow rate of the second fluid material is from 1000:1 to 2:1, for example 100:1 to 25:1.

For example, the first and the second fluid materials are applied such that a total thickness of the first and the second fluid materials together is from 0.5-20 mm, especially 1-15 mm, for example 2-8 mm.

In particular, the first fluid material is applied with a width larger than the second fluid material, whereby the widths are measured in a direction perpendicular to the direction of application. Especially, the width of the first fluid material equals 1.1-3 times, in particular 1.1-2 times, for example 1.1-1.5 times, the width of the second fluid material.

Thereby, in particular, the second fluid material is applied with a larger height than the first fluid material. In this case, the widths of the fluid materials can be adjusted upon compression or during bonding, respectively, in order to obtain the same width for the first and the second fluid material after compression or bonding, respectively.

However, according to another preferred implementation, the first fluid material and the second fluid material are applied with essentially identical widths, whereby the widths are measured in a direction perpendicular to the direction of application. In this case, for example, the width of the first fluid material is 90-110%, especially 95-105%, of the width of the second fluid material.

In particular, the first fluid material is chemically different from the second fluid material. Especially the first fluid material is a first type of adhesive and the second fluid material is a second type of adhesive material. Both adhesive compositions preferably are polyurethane based adhesive compositions.

In another preferred embodiment, the second fluid material is an adhesive composition, especially a polyurethane based adhesive composition, and the first fluid material is a curing accelerator for the adhesive composition.

If applied, the at least one further fluid material in particular is different from the first and the second fluid material. Especially, the at least one further fluid material is an adhesive material and/or a sealant.

In a further preferred implementation of the inventive method, another substrate is pressed on the bead as applied on the substrate in order to obtain an adhesive bonding between the two substrates.

In a special implementation, the substrate is a plastic, glass and/or a ceramic material and the other substrate is a metallic material, optionally coated with a paint. For example, the substrate is a windshield, a plastic screen and/or a glass screen and the further substrate is a structural element, in particular a vehicle body.

A still further aspect of the present invention is directed to the use of a multi-orifice nozzle as described above or of a kit of parts as described above for adhesively bonding a glass and/or ceramic material, especially a vehicle window, to a structural element, in particular to a metallic element, optionally coated with a paint, especially to a vehicle body.

Further advantageous implementations of the invention are evident from the exemplary embodiments.

BRIEF DESCRIPTION OF THE DRAWINGS

The drawings used to explain the embodiments show.

EXEMPLARY EMBODIMENTS

Figure 1:
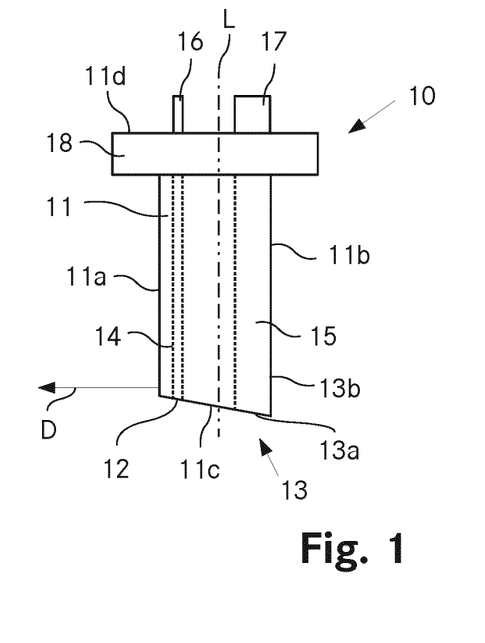
FIG. 1 A side-view of a first multi-orifice nozzle according to the invention.

FIG. 1 shows a side-view of a first multi-orifice nozzle 10 according to the invention. The nozzle 10 comprises an elongated cuboidal housing 11. In FIG. 1, the front side 11a of the housing 11 points to the left, i.e. into the direction of application D of the nozzle 11. The backside 11b points to the right, i.e. opposite to the direction of application D.

The downstream end face 11c stands at an angle of about 80° to the longitudinal axis L of the housing 11. In the end face 11c, there are a first discharge orifice 12 and second discharge orifice 13. With respect to the application direction D, the first discharge orifice 12 is arranged in front of the second discharge orifice 13.

Figure 2:
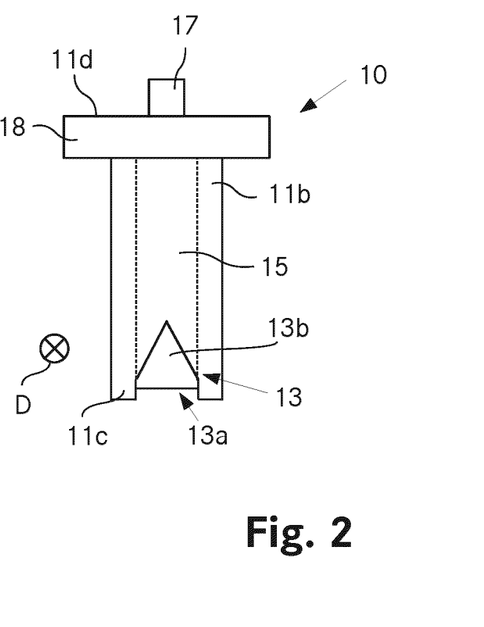
FIG. 2 A view onto the backside of the nozzle of FIG. 1.
Figure 3:
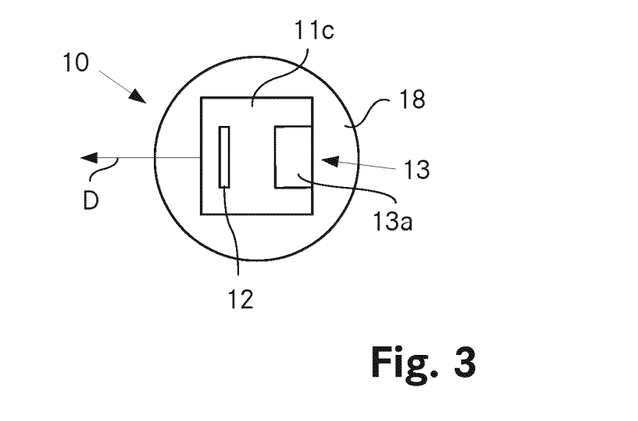
FIG. 3 A view onto the downstream end face of the nozzle of FIGS. 1 and 2.

As shown in the view onto the downstream end face 11c in FIG. 3, the first discharge orifice 12 is a slit-shaped or rectangular-shaped orifice. As can be seen from FIGS. 2 and 3, the second discharge orifice 13 consists of a triangular-shaped rear opening 13b in the backside 11b of the nozzle housing 11 and a rectangular-shaped base opening 13a in the downstream end face 11c of the nozzle housing 11, whereby the rear opening 13b and the base opening 13a form a continuous opening.

The width of the first discharge orifice 12 and the width of the second discharge orifice 13, measured in a direction perpendicular to the direction of application D are essentially identical.

The first discharge orifice 12 is connected via a first fluid line 14 with a first tubular socket 16 protruding from the upstream end face 11d of the nozzle housing 11. Likewise, the second discharge orifice 13 is connected via a second fluid line 15 with a second tubular socket 17 also protruding from the upstream end face 11d. The sockets 16, 17 serve as inlets for supplying fluid materials via the fluid lines 14, 15 to the orifices 12, 13, where the fluid materials can be discharged and applied onto a substrate.

Directly below the upstream end face 11d of the nozzle housing 11, a circumferential circular flange 18 protrudes in a direction perpendicular to the longitudinal axis L, which can serve as an interface to couple the nozzle 10 with a dispensing device (cf. FIG. 4).

Figure 4:
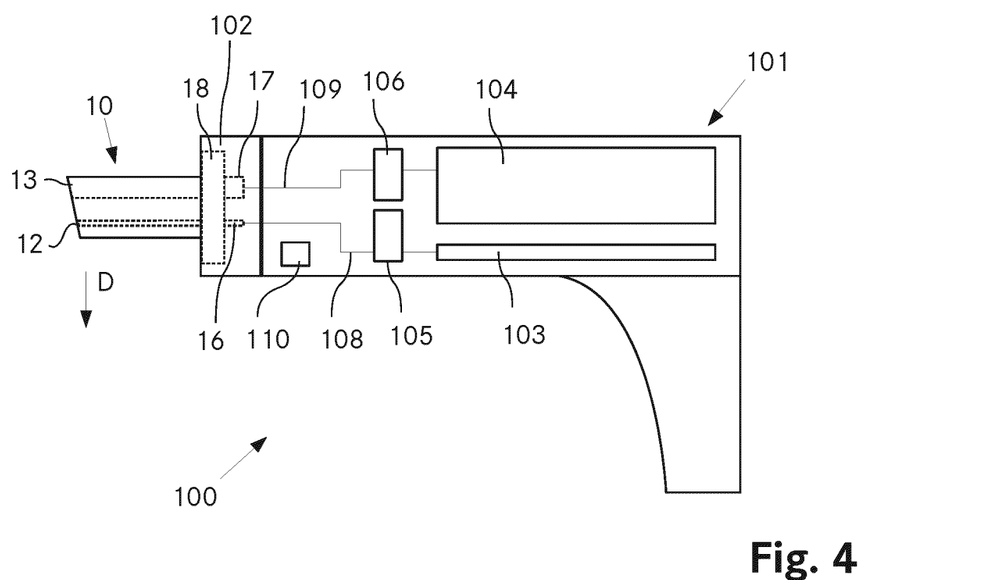
FIG. 4 A kit-of-parts comprising the nozzle of FIG. 1-3 mounted in a handheld dispensing device.

FIG. 4 shows a kit of parts 100 consisting of the nozzle 10 shown in FIG. 1-3 mounted in a handheld dispensing device 101. The dispensing device comprises an interface 102 with a locking mechanism for fixing the nozzle 10 via the flange 18 in the dispensing device 101.

Furthermore, the dispensing device 101 comprises a first reservoir 103 with a first fluid material (e.g. a first kind of adhesive). The first fluid material can be supplied with a pump 105 via an internal supply line 108 to the first inlet 16 of the nozzle 10. Also, a second reservoir 104 with a second fluid material (e.g. a second kind of adhesive) is comprised in the dispensing device 101. The second fluid material can be supplied with a further pump 106 via another internal supply line 109 to the second inlet 17 of the nozzle 10.

Additionally, a control unit 110 is present in the dispensing device 101 and configured for individually controlling the flow rates of the pumps 105, 106. This allows for individually discharging the fluid materials through the orifices 12, 13 of the nozzle 10 with adjustable flow rates suitable for a specific application.

Figure 5:
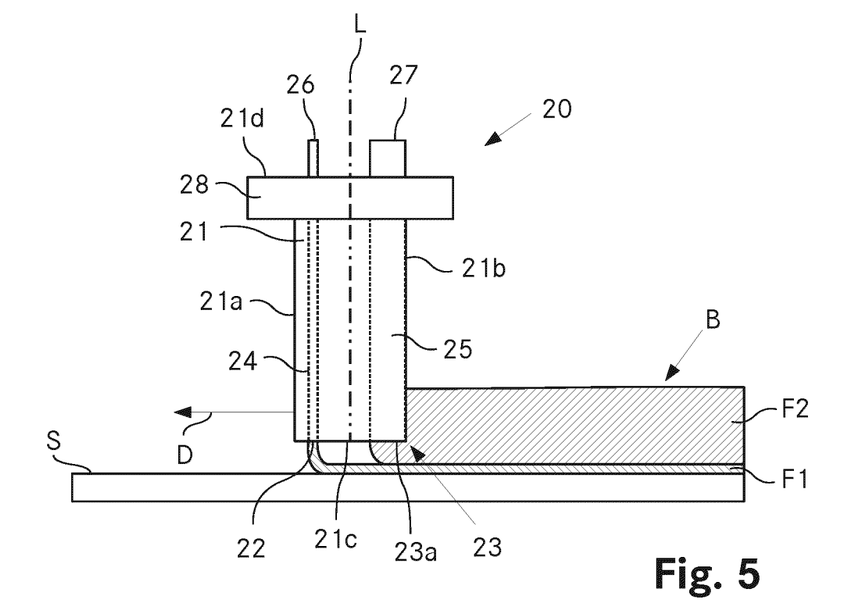
FIG. 5 A second multi-orifice according to the invention during application of a bead from two different fluid materials onto a substrate.

FIG. 5 shows in the central part a second multi-orifice nozzle 20 according to the invention. In large parts, the nozzle 20 is essentially identical in design with nozzle 10. Features of nozzle 20 corresponding to the respective features of nozzle 10 are labelled with a reference number that equals the reference number plus 10. For example, part 21 of nozzle 20 corresponds to part 11 of nozzle 10.

However, nozzle 20 differs from nozzle 10 in that the downstream end face 21c stands at an angle of about 90° to the longitudinal axis L of the housing 21. This is a configuration that is more suitable when using the multi-orifice nozzle for example with a robotic system.

Figure 7:
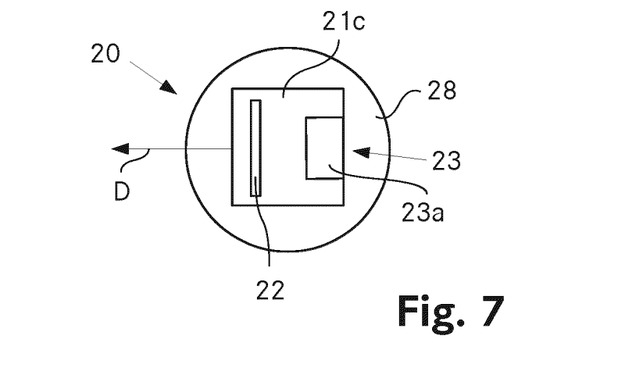
FIG. 7 A view onto the downstream end face of the nozzle of FIGS. 5 and 6.

Furthermore, measured in a direction perpendicular to the direction of application D, the width of the first discharge orifice 22 is larger than the width of the second discharge orifice 23 (shown in the view onto the downstream end face 21c in FIG. 7).

FIG. 5 additionally shows the multi-orifice nozzle 20 in operation during application of a bead B from two different fluid materials F1, F2. Specifically, in FIG. 5, a situation is shown in which the nozzle 20 is moved over a substrate S (e.g. a glass screen) towards the left side in the direction of application D. Thereby, the first fluid material F1 (e.g. a first type of adhesive) is directly applied onto the substrate S and the second fluid material F2 (e.g. a second type of adhesive) is applied onto the first fluid material F1 already deposited on the substrate S. This results in a layered bead of the two fluid materials on the substrate S.

Figure 6:
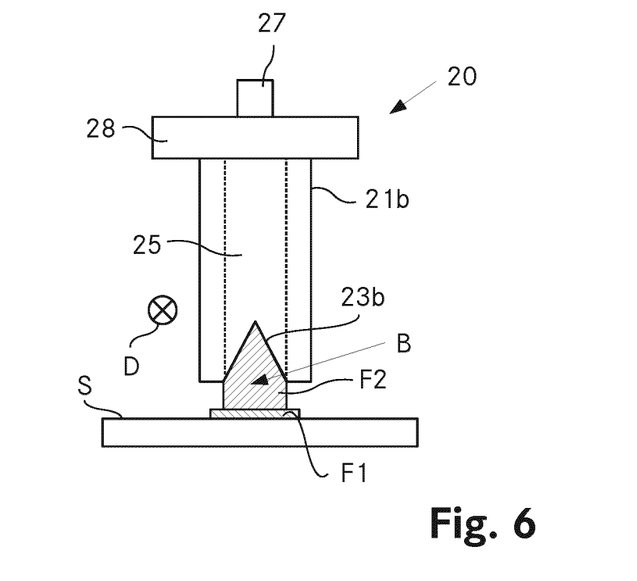
FIG. 6 A view onto the backside of the nozzle of FIG. 5.

FIG. 6 shows the situation of FIG. 5 in a view onto the backside 25 of the nozzle 20. Because of the larger width of the first discharge orifice 22, the first fluid material F1 as applied on the substrate S has a larger width than the second fluid material F2, which is applied on top of the first fluid material F1. Furthermore, due to the triangular-shaped section 23b of second discharge orifice 23, the bead B produced has an upper end with a triangular-shaped cross-section.

FIG. 7 shows a view onto the downstream end face 21c of nozzle 20. As explained above, measured in a direction perpendicular to the direction of application D, the width of the first discharge orifice 22 is larger than the width of the second discharge orifice 23.

Figure 8:
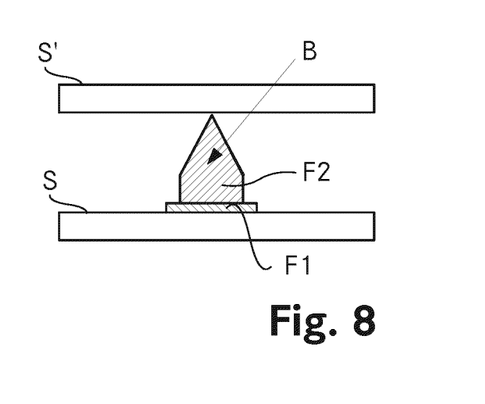
FIG. 8 A substrate with a bead as obtained with the procedure shown in FIG. 6 with a second substrate positioned on top of the bead.
Figure 9:
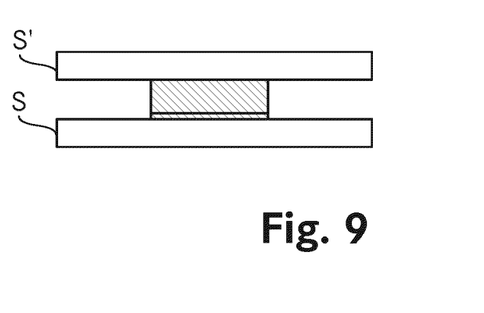
FIG. 9 The arrangement of FIG. 8 after pressing the second substrate onto the bead in order to adhesively bond the two substrates together.

FIG. 8 shows the substrate S with the bead B as applied with the procedure described in FIGS. 5 and 6. In order to bond the substrate S with a second substrate S', the second substrate S' is positioned on top of the bead B, as shown in FIG. 8. Subsequently, the second substrate S' is pressed onto the bead B, resulting in the substrate S' being bonded to substrate S via bead B. This situation is schematically shown in FIG. 9. Since the height of the second fluid material F2 is larger than the height of the first fluid material, upon pressing the second substrate S' ono the bead B, the second fluid material F2 is widened more than the first fluid material F1. This allows for obtaining a similar width of the two materials F1, F2 in the bonded state as shown in FIG. 9.

It will be appreciated by those skilled in the art that the present invention can be implemented in other specific forms without departing from the spirit or essential characteristics thereof. The presently disclosed implementations and embodiments are therefore considered in all respects to be illustrative and not restricted.

The invention claimed is:

1. A multi-orifice nozzle for application of a bead from at least two different fluid materials on a substrate, comprising:
   a nozzle housing having a front side to be oriented forward in an intended direction of application during use of the nozzle;
   a first discharge orifice for application of a first fluid material on the substrate; and
   a second discharge orifice for application of a second fluid material on the substrate; wherein
   the first and the second discharge orifices are arranged such that when moving the nozzle with the front side oriented forward in the intended direction of application, with respect to the intended direction of application, the second discharge orifice is behind the first discharge orifice,
   the first discharge orifice comprises a slit-shaped opening in a downstream end face of the nozzle housing,
   the second discharge orifice comprises a rear opening in a backside of the nozzle housing and a base opening in the downstream end face of the nozzle housing, and
   the rear opening and the base opening form a continuous opening.

2. The multi-orifice nozzle according to claim 1, wherein the first discharge orifice and the second discharge orifice are configured for producing a layered bead in which the second fluid material is applied over the first fluid material.

3. The multi-orifice nozzle according to claim 1, wherein the first discharge orifice and the second discharge orifice are in a downstream end face of the nozzle housing, and the downstream end face of the nozzle housing is configured as a contact surface to be oriented towards a surface of the substrate during use of the nozzle.

4. The multi-orifice nozzle according to claim 1, wherein the nozzle is configured such that the first fluid material can be applied independently of the second fluid material.

5. The multi-orifice nozzle according to claim 1, comprising a first fluid line, which is in fluid communication with the first discharge orifice, for supplying the first fluid material to the first discharge orifice and a second fluid line, which is in fluid communication with the second discharge orifice for supplying the second fluid material to the second discharge orifice.

6. The multi-orifice nozzle according to claim 5, wherein a first inlet of the first fluid line and/or a second inlet of the second fluid line is at an upstream end face of the nozzle housing, and the upstream end face is opposite the downstream end face of the nozzle housing.

7. The multi-orifice nozzle according to claim 1, wherein a width of the first discharge orifice is 90-110% of a width of the second discharge orifice, and the widths of the first discharge orifice and the second discharge orifice are measured in a direction perpendicular to the intended direction of application and/or in a direction parallel to the front side.

8. The multi-orifice nozzle according to claim 1, wherein the first discharge orifice is configured for producing a flat bead and/or the second discharge orifice is configured for producing a V-shaped bead.

9. The multi-orifice nozzle according to claim 1, wherein the rear opening is triangular and the base opening is rectangular.

10. The multi-orifice nozzle according to claim 1, wherein an opening area of the first discharge orifice is smaller than an opening area of the second discharge orifice.

11. A kit of parts comprising
a multi-orifice nozzle according to claim 1, and
a dispensing device, wherein
the dispensing device is configured for coupling the multi-orifice nozzle and
the dispensing device is configured for supplying a first fluid material from a first reservoir and a second fluid material from a second reservoir such that, if the multi-orifice nozzle is coupled to the dispensing device, the first fluid material can be discharged through the first discharge orifice of the nozzle and the second fluid material can be discharged through the second discharge orifice of the nozzle.

12. A method for application of a bead from at least two fluid materials on a substrate with the multi-orifice nozzle according to claim 1, comprising
moving the multi-orifice nozzle in a direction of application with a front side of the multi-orifice nozzle oriented towards the direction of application along a substrate and thereby applying a first fluid material through the first discharge orifice and a second fluid material through the second discharge orifice, such that the first fluid material is directly applied on the substrate and the second fluid material is applied over the first fluid material, wherein
a layered bead in which the second fluid material is placed over the first fluid material is obtained.

13. The method according to claim 12, wherein the first and the second fluid material are applied such that a first thickness of the first fluid material as applied on the substrate is smaller than a second thickness of the second fluid material as applied on the first fluid material.

14. The method according to claim 12, wherein the first fluid material is chemically different from the second fluid material and the first fluid material is a first type of adhesive and the second fluid material is a second type of adhesive material.

15. A method comprising using the multi-orifice nozzle according to claim 1 for adhesively bonding a glass and/or ceramic material.

* * * * *